US011543474B1

United States Patent
Schwindt et al.

(10) Patent No.: US 11,543,474 B1
(45) Date of Patent: Jan. 3, 2023

(54) OPTICALLY PUMPED GRADIENT MAGNETOMETER

(71) Applicants: National Technology & Engineering Solutions of Sandia, LLC, Albuquerque, NM (US); QuSpin, Inc., Louisville, CO (US)

(72) Inventors: Peter Schwindt, Albuquerque, NM (US); Yuan-Yu Jau, Albuquerque, NM (US); Kaleb Lee Campbell, Albuquerque, NM (US); Vishal Shah, Louisville, CO (US)

(73) Assignees: National Technology & Engineering Solutions of Sandia, LLC, Albuquerque, NM (US); Quspin, Inc., Louisville, CO (US)

( * ) Notice: Subject to any disclaimer, the term of this patent is extended or adjusted under 35 U.S.C. 154(b) by 0 days.

(21) Appl. No.: 17/380,860

(22) Filed: Jul. 20, 2021

Related U.S. Application Data

(60) Provisional application No. 63/062,656, filed on Aug. 7, 2020.

(51) Int. Cl.
   *G01R 33/26* (2006.01)
   *G01R 33/12* (2006.01)
   *G04F 5/14* (2006.01)

(52) U.S. Cl.
   CPC ......... *G01R 33/26* (2013.01); *G01R 33/1284* (2013.01); *G04F 5/145* (2013.01)

(58) Field of Classification Search
   CPC ...... G01R 33/26; G01R 33/1284; G04F 5/145

USPC ........................................................ 324/304
See application file for complete search history.

(56) References Cited

U.S. PATENT DOCUMENTS

| 10,088,535 | B1 * | 10/2018 | Shah | ..................... G01R 33/26 |
| 2018/0238974 | A1 * | 8/2018 | Shah | .................. G01R 33/323 |

OTHER PUBLICATIONS

Schwindt, P. D. D., "Optical Beat Note Readout of a Magnetic Gradient," SAND2019-9517C, Aug. 2019, Sandia National Laboratories, Albuquerque, NM, 30 pages.

(Continued)

*Primary Examiner* — Christopher P Mcandrew
(74) *Attorney, Agent, or Firm* — Martin I. Finston; Mark A. Dodd

(57) ABSTRACT

A method is provided for sensing a magnetic field in a magnetic gradiometer of the kind in which pump light and light constituting an optical carrier traverse first and second atomic vapor cells that contain host atoms and that are separated from each other by a known distance. According to such method, the host atoms are prepared in a coherent superposition of two quantum states that differ in energy by an amount that is sensitive to an ambient magnetic field. Modulation of the optical carrier in the respective cells gives rise to sidebands that interfere to generate a beat frequency indicative of the magnetic field gradient. The host atoms are prepared at least in a mode that allows measurement of ambient magnetic field components perpendicular to the axis of the pump light. In such mode, the host atoms are spin-polarized by pump light while subjected to a controlled magnetic field directed parallel to the pump beam, and then the controlled magnetic field is adiabatically extinguished.

19 Claims, 10 Drawing Sheets

(56) References Cited

OTHER PUBLICATIONS

Campbell, K. et al., "Pulsed Gradiometry in Earth's Field," 2020, abstract, DAMOP20 Meeting of The American Physical Society, 1 page.
Campbell, K. et al., "Towards a Pulsed Dead-Zone Free Gradiometer in Earth's Field," SAND201-9338C, Aug. 2019, Sandia National Laboratories, Albuquerque, NM, 25 pages.
Tang, H. "Parametric Frequency Conversion of Resonance Radiation in Optically Pumped $Rb^{87}$ Vapor," Physical Review A, 1973, vol. 7, pp. 2010-2033.
Tang, H. and Happer, W., "Parametric Frequency Conversion of Resonance Radiation in Optically Pumped Rubidium-87 Vapor," Physical Review Letters, 1970, vol. 24, pp. 551-554.
Kominis, I. K. et al. "A Subfemtotesla Multichannel Atomic Magnetometer," Nature, 2003, vol. 422, pp. 596-599.
Allred, J. C. et al., "High-Sensitivity Atomic Magnetometer Unaffected by Spin-Exchange Relaxation," Physical Review Letters, 2002, vol. 89, 130801-1-130801-.4.
Sulai, I.A. et al., "Characterizing atomic magnetic gradiometers for fetal magnetocardiography," Review of Scientific Instruments, 2019, vol. 90, 85003.
Boto, E. et al., Moving Magnetoencephalography towards Real-world Applications with a Wearable System, Nature, 2018, vol. 555, pp. 657-661 (20 pages total).
Cohen, D., "Magnetoencephalography: Detection of the Brain's Electrical Activity with a Superconducting Magnetometer," Science, 1972, vol. 175, pp. 664-666.
Bell, W. E. and Bloom, A. L.,"Optical Detection of Magnetic Resonance in Alkali Metal Vapor," Physical Review, 1957, vol. 107, p. 1559-1565.
Rosenberry, M. A. et al., "Radiation Trapping in Rubidium Optical Pumping at Low Buffer-Gas Pressures," Physical Review A, 2007, vol. 75, 023401-1-023401-6.
Vanier, J. et al., "On Hyperfine Frequency Shifts Caused by Buffer Gases: Application to the Optically Pumped Passive Rubidium Frequency Standard," Journal of Applied Physics, 1982, vol. 53. pp. 5387-5391.
Sulai, I.A. et al., "Characterizing atomic magnetic gradiometers for fetal magnetocardiography," arXiv:1906.03227v1 [physics.ins-det], Jun. 7, 2019, 11 pages (slightly different than NPL8).

* cited by examiner

OPTICALLY PUMPED GRADIENT MAGNETOMETER

CROSS-REFERENCE TO RELATED APPLICATION

This application claims priority to U.S. Provisional Application Ser. No. 63/062,656, filed Aug. 7, 2020 under the title, "OPTICALLY PUMPED GRADIENT MAGNETOMETER", the entirety of which is hereby incorporated herein by reference.

STATEMENT OF GOVERNMENT RIGHTS

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

The present invention relates in general to magnetometers, and in particular to atomic magnetometers that operate by optically polarizing an alkali metal vapor and optically probing the state of magnetization of the polarized alkali metal atoms to sense a magnetic field.

ART BACKGROUND

High-sensitivity detection of magnetic fields plays an important role in applications such as ordnance detection, geophysical mapping, navigation, and the detection of biomagnetic fields associated with heart and brain activity. Conventional superconducting magnetometers are based on superconducting quantum interference devices (SQUIDs). These instruments provide high sensitivity for magnetic field detection, but they are bulky and they require expensive cryogenic cooling.

Atomic magnetometers, which offer an alternative approach to magnetic field detection, are being developed. Atomic magnetometers are based on optical measurements of unpaired electron spin in an alkali metal vapor. These measurements can be made without cryogenic cooling, and they can measure the absolute magnetic field at high sensitivity, potentially down to one femtotesla or less.

In operation, an atomic magnetometer measures the transition frequency between two magnetically sensitive ground states of an atom that has an unpaired electron. Examples include rubidium (Rb), cesium (Cs), and potassium (K). If the transition is between Zeeman levels of the same hyperfine ground state, the transition frequency will typically lie within the radio-frequency (RF) spectrum, i.e., in the 1-1000 kilohertz range. If the transition is between Zeeman levels of two different hyperfine states, the transition frequency will lie within the microwave spectrum, typically in the gigahertz range.

Practitioners in the field of magnetometry have recognized that direct measurements of the magnetic field are subject to contamination by noise from various sources. For that reason, magnetic gradiometers, also referred to herein as gradient magnetometers, have been used in various applications such as brain imaging. Instead of measuring the magnetic field directly, a gradiometer measures the difference in the magnetic field as detected at two fixed locations a known distance apart. Such a device has the advantage of rejecting common-mode magnetic field noise.

Until recently, the preferred approach to gradient magnetometry in atomic systems has been the synthetic approach, in which the respective outputs of two separate magnetometers are subtracted electronically. Although useful, this synthetic approach is technologically complex, and it is not assured to provide perfect noise cancellation over the entire frequency range of interest.

The synthetic approach is not the only approach possible. An alternative approach is the intrinsic approach, in which the magnetic field gradient is measured directly.

One example of an intrinsic magnetic gradiometer is provided by U.S. Pat. No. 10,088,535, issued Oct. 2, 2018 to Vishal Shah, the entirety of which is hereby incorporated herein by reference.

In the gradiometer of U.S. Pat. No. 10,088,535, which we refer to below as the "Shah device," respective ensembles of atoms are confined in two physically separated locations. State preparation of the confined atoms produces a freely precessing coherent superposition of two magnetically sensitive hyperfine ground states in each location. One method of state preparation is by irradiation with a beam of light from a suitably tuned pump laser.

A probe laser beam having a carrier frequency is used to interrogate the atoms in the respective locations of the Shah device. As the probe light beam passes through the prepared atomic ensembles, optical sidebands are parametrically generated at the ground-state hyperfine frequency of the magnetically sensitive states. The sidebands produced by each ensemble lie at a frequency separation from the carrier that is proportional to the magnetic field experienced at the respective location where that ensemble is confined.

A photodetector then captures the probe light. Interference between the sidebands generated at the respective locations produces a beat note at a beat frequency proportional to the magnetic field gradient between the two ensembles. The beat frequency, which is measurable in the photodetector output, thus provides a reading of the magnetic field gradient.

Although current implementations of the Shah device are useful, there are opportunities to make the Shah device more versatile and convenient to operate.

SUMMARY OF THE INVENTION

For example, one useful modification would provide a non-zero beat-note output signal at zero external magnetic field, for purposes of calibration and diagnosis.

Another useful modification would cancel thermal effects that could otherwise contaminate the output signal.

Another useful modification would relax the requirement for the pump beam to be parallel to the external magnetic field, thus removing dead zones, i.e., pointing directions relative to the external magnetic field that produce a severely attenuated response. Still further modification would permit the pump and probe beams to share the same propagation axis without suffering dead zones.

We have developed modifications to the Shah device that can effectuate the improvements listed above.

In our improved gradiometer, the two atomic ensembles are embodied in alkali metal vapor confined within respective vapor cells separated by a baseline distance. For state preparation, the atomic ensembles are spin polarized by optical pumping from a pump laser. A microwave $\pi/2$ pulse is applied to the cells. The frequency of this pulse is chosen to resonate with a pair of magnetically sensitive energy levels of different ground-state hyperfine manifolds of the alkali metal atom. As a consequence, the $\pi/2$ pulse induces coherent free spin precession in the atoms.

In an illustrative example, two $^{87}$Rb vapor cells are used. The atoms are pumped into the $|F=2, m_F=2\rangle$ stretched state. Then, the microwave-frequency $\pi/2$ pulse is applied to induce a superposition between the $|2,2\rangle$ and $|1,1\rangle$ levels.

A probe laser beam tuned to an optical resonance line such as the D1 or D2 transition is passed through the precessing atomic spins. By way of illustration, the probe beam in the example mentioned above had a wavelength of 780 nm. More generally, the probe can be tuned near any resonant optical transition in the atom, and maximum signal will typically be found by detuning the laser approximately one optical linewidth from the resonance.

The light from the probe beam interacts with the coherently precessing atoms and becomes modulated at a microwave frequency proportional to the magnetic field experienced by the atoms in each respective ensemble. As explained above, this microwave modulation parametrically generates optical sidebands separated from the probe, or "carrier," frequency by a shift equal to the frequency of the hyperfine splitting.

Residual carrier that has not interacted with the atoms is removed by filtration so that, substantially, only the optical sidebands survive to impinge on the photodetector.

Zero-field output signal. To maintain a finite beat frequency at zero external magnetic field, we utilized the buffer gas within the atomic vapor cell. As is known in the art, it is desirable to include buffer gases to decrease the rate of depolarization from cell-wall collisions and to limit the effects of radiation trapping, which can hinder efficient optical pumping.

However, the buffer gas also tends to shift the hyperfine frequency of the confined atoms. This shift depends on the buffer gas density and on the temperature. As a function of temperature, it can be approximated as the sum of a constant term, a linear term, and a small quadratic term. The shift is positive for light buffer molecules such as hydrogen, helium, neon, and nitrogen. It is negative for heavier molecules such as argon and krypton.

Accordingly, we found that by filling the respective cells with buffer gases at different pressures, we were able to produce an offset between the respectively generated sidebands that would generate a designated beat frequency at zero applied magnetic field. Alternatively, the cells could be filled with different buffer gas compositions, or with fills that differ both in composition and in pressure, for a similar result. In our illustrative example using $^{87}$Rb, the cells were filled with nitrogen at respective pressures suitable to produce a zero-field beat frequency of 7 kHz at a chosen operating temperature.

Cancellation of thermal effects. As explained above, the atomic ensembles in our illustrative example are prepared in a coherent superposition of the $|F=2, m_F=2\rangle$ and $|F=1, m_F=1\rangle$ levels. Here, F=2 and F=1 provide a non-limiting example of two different hyperfine ground states, and $m_F=2$ and $m_F=1$ provide a non-limiting example of Zeeman levels of the respective hyperfine ground states that can be coherently superposed.

Accordingly, the microwave transition excited by the $\pi/2$ pulse in our illustrative example is the $|1, 1\rangle \rightarrow |2, 2\rangle$ transition. However, the $|1,-1\rangle \rightarrow |2, -2\rangle$ transition is also an allowed transition. The frequency shift caused by an external magnetic field of strength B in the $|1, 1\rangle \rightarrow |2, 2\rangle$ transition is $+3\gamma B$, and the shift caused in the $|1, -1\rangle \rightarrow |2, -2\rangle$ transition is $-3\gamma B$. The coefficient $\gamma$ is the gyromagnetic ratio. In our illustrative example, which uses $^{87}$Rb, $\gamma$ is about seven Hertz per nanotesla (i.e., about 7 Hz/nT).

Each of these transitions adds a sideband to the probe output from each cell. In the probe spectrum, the position of the sideband, measured relative to the carrier frequency, is the sum of the zero-field hyperfine frequency plus the shift due to the external magnetic field. Doing a Taylor series expansion to first order of the Breit-Rabi formula which describes the energy level shifts of the ground state hyperfine manifold with respect to the magnetic field, we find the sideband is at $(1/2\pi)\omega_{\mathcal{A}}(T)+3\gamma B_{\mathcal{A}}$ or $(1/2\pi)\omega_{\mathcal{B}}(T)+3\gamma B_{\mathcal{B}}$ for the $|1, 1\rangle \rightarrow |2, 2\rangle$ transition and at $(1/2\pi)\omega_{\mathcal{A}}(T)-3\gamma B_{\mathcal{A}}$ or $(1/2\pi)\omega_{\mathcal{B}}(T)-3\gamma B_{\mathcal{B}}$ for the $|1, -1\rangle \rightarrow |2, -2\rangle$ transition, where $\mathcal{A}$ designates one of the two cells and $\mathcal{B}$ designates the other, and $\omega$ designates the zero-field hyperfine frequency for the $|1, 1\rangle \rightarrow |2, 2\rangle$ transition.

For conciseness, we will refer below to the $|1, 1\rangle \rightarrow |2, 2\rangle$ transition as the same item "incremental" transition and to the $|1, -1\rangle \rightarrow |2, -2\rangle$ transition as the "decremental" transition.

The beat note produced between cells $\mathcal{A}$ and $\mathcal{B}$ for the incremental transition is $(1/2\pi)(\omega_{\mathcal{A}} - \omega_{\mathcal{B}}) + 3\gamma(B_{\mathcal{A}} - B_{\mathcal{B}})$.

The beat note produced between cells $\mathcal{A}$ and $\mathcal{B}$ for the decremental transition is $(1/2\pi)(\omega_{\mathcal{A}} - \omega_{\mathcal{B}}) - 3\gamma(B_{\mathcal{A}} - B_{\mathcal{B}})$.

The difference between these two beat notes is $6\gamma(B_{\mathcal{A}} - B_{\mathcal{B}})$.

However, it is important to note there are higher order effects with respect to the magnetic field, but only the odd orders contribute when taking the difference between the left and right side resonances. There is some residual temperature dependence contained in the higher order terms but this is negligible in typical ambient fields.

Accordingly, we found that we could cancel thermal effects of the hyperfine buffer gas shift from the output signal of our device by subtracting the decremental beat note from the incremental beat note, or vice versa. We refer to such an approach as "double-sided interrogation."

Single laser axis, dead-zone free operation. The operation of the magnetometer is constrained by quantum selection rules. One consequence of the selection rules is that optical pumping to the left ($|2, -2\rangle$) or right ($|2, 2\rangle$) end state requires the ambient magnetic field to be substantially parallel to the pump beam. Another consequence is that in order for $\sigma^+$ or $\sigma^-$ microwave transitions (i.e., transitions in which the magnetic quantum number $m_F$ changes by $\pm 1$) to generate sidebands, the ambient magnetic field must have a non-zero component perpendicular to the probe beam. Otherwise, a $\pi$ microwave transition must be used, in which $m_F$ does not change. Transitions of that kind, however, are forbidden from the left and right end states.

As a consequence, unless these obstacles are overcome, a magnetometer will exhibit dead zones. When the pump and probe beam are perpendicular to each other, the system will have a dead zone when the magnetic field lies in the plane perpendicular to the optical pumping beam. To make the system compact, it is convenient to have the pump and probe beam copropagating. In this case, there are dead zones both parallel and perpendicular to the propagation axis, and these must be eliminated to make an effective sensor.

Our solution combines two different adiabatic processes that transform a prepared but potentially non-responsive state of the atomic ensemble to a state capable of producing an output signal:

To produce an output signal when the ambient field is perpendicular to the laser axis, we initially apply a parallel field from an external coil while the atoms are optically pumped to either the left or right end state. Once the optical pumping is completed, we adiabatically rotate the quantization axis to the direction of the ambient field by de-energizing the coil along the optical pumping axis.

To produce an output signal when the ambient field is parallel to the laser axis, the atomic ensemble is prepared in two stages. First, the pump prepares, in examples, a |2, 2> population of atomic states. Then, a microwave state-preparation pulse transfers the |2, 2> population to the |1, 1> state by the well-known process of adiabatic rapid passage (ARP). A microwave π/2 pulse then creates a coherent superposition of |1, 1> and |2, 1> states.

Accordingly, the invention relates to a method for sensing a magnetic field in a magnetic gradiometer of the kind in which pump light and light constituting an optical carrier traverse first and second atomic vapor cells that contain host atoms and that are separated from each other by a known distance.

According to such method, the host atoms are prepared in a coherent superposition of two quantum states that differ in energy by an amount that is sensitive to an ambient magnetic field. Modulation of the optical carrier in the respective cells gives rise to sidebands that interfere to generate a beat frequency indicative of the magnetic field gradient.

The host atoms are prepared at least in a mode that allows measurement of ambient magnetic field components perpendicular to the axis of the pump light. In such mode, the host atoms are spin-polarized by pump light while subjected to a controlled magnetic field directed parallel to the pump beam, and then the controlled magnetic field is adiabatically extinguished.

In embodiments, the host atoms are atoms of rubidium-87. In addition to the host atoms, the atomic vapor cells are filled with a buffer gas such as nitrogen, or with a buffer gas mixture. In embodiments, a buffer gas fill that differs in composition and/or in pressure between the two cells is used to produce a non-zero beat frequency even when no ambient magnetic field is present.

In various embodiments, the sidebands are isolated from the optical carrier by a polarization-sensitive optical element or by an optical narrow-band frequency filter or an atomic filter cell, so that light that effectively contains only the sidebands is impinged on a photodetector. By "effectively" is meant that the desired photodetector response indicating the beat frequency is readily distinguishable from background noise.

In embodiments, the pump light and optical carrier are respectively tuned to a D1 atomic transition and a D2 atomic transition of the host atoms, or vice versa. In embodiments, the coherent superposition is between Zeeman sublevels of two distinct hyperfine manifolds. For example, the atomic ensembles may be prepared in a coherent superposition of |F=2, $m_F$=2> and |F=1, $m_F$=1> levels, wherein F=2 and F=1 represent different hyperfine ground states, and $m_F$=2 and $m_F$=1 are Zeeman sublevels of the hyperfine ground states. In embodiments, a microwave π/2 pulse having a frequency chosen to resonate with a pair of magnetically sensitive hyperfine energy levels is used to place the spin-polarized host atoms into the coherent superposition.

In embodiments, the optical carrier is modulated using different atomic transitions, so that each of the atomic vapor cells gives rise to an incremental sideband and a decremental sideband having different frequencies. The beat frequency between incremental sidebands and the beat frequency between decremental sidebands are subtracted from each other to provide a magnetic field measurement with decreased sensitivity to temperature.

In embodiments, the host atoms are prepared in a further mode that permits sensing of magnetic field components parallel to the axis of the optical carrier. In such mode, the host atoms are initially spin-polarized in a first hyperfine state, transferred using an initial microwave pulse to a second hyperfine state, and then placed by a microwave π/2 pulse in a coherent superposition of the second hyperfine state with a third hyperfine state having the same value of the hyperfine angular momentum quantum number $m_F$ as the second hyperfine state. In embodiments, the transfer from the first to the second hyperfine state is effectuated by adiabatic rapid passage (ARP).

In some embodiments that permit sensing of magnetic field components parallel to the carrier axis, the pump beam and the optical carrier traverse parallel paths through the atomic vapor cells. In some such embodiments, the B-parallel mode and the B-perpendicular mode are performed in alternation.

In embodiments, source light from a single light source provides, sequentially, both the pump beam and the optical carrier. For example, the pump light may be provided initially as a strong pulse for optical pumping, and then it may be attenuated and detuned to provide the optical carrier.

As those skilled in the art will recognize, the various adaptations described above for, e.g., zero-field signal output, reduced temperature sensitivity, operation with the optical carrier parallel to the ambient field, co-propagation of the pump light and optical carrier, and use of a single source laser for the pump light and optical carrier, are combinable in any combination.

BRIEF DESCRIPTION OF THE DRAWINGS

FIG. 10 shows the orientations of the laser axis, the ambient field B, and the coil field $B_C$. FIG. 11 is a partial transition diagram showing the spin states that are involved in an example. FIG. 12 is a timing diagram that provides an example of the sequence of the pulses used for state preparation in the B-parallel mode of operation.

DETAILED DESCRIPTION

The host atomic system for the illustrative embodiment described here is the $5S_{1/2}$ ground state of $^{87}$Rb. Possible alternative host systems include $^{85}$Rb, $^{133}$Cs, $^{39}$K, $^{41}$K, helium (He), and artificial atoms such as nitrogen vacancy centers.

It should be noted that whereas some Zeeman magnetometers of the prior art operate with transitions involving a pair of Zeeman sublevels of the same hyperfine manifold (i.e., having the same total angular momentum quantum number F), the hyperfine gradiometer described here utilizes a pair of Zeeman sublevels of two distinct hyperfine manifolds (e.g., F=1 and F=2). This is noteworthy, not least because the transition frequency between two distinct hyperfine manifolds is usually in the range of hundreds of megahertz to several gigahertz, whereas the transition frequencies between the Zeeman sublevels in the same hyperfine manifold are typically on the order of hundreds of kilohertz in the terrestrial magnetic field.

In our magnetometer, the magnetic energy of a microwave pulse induces Rabi oscillations between the two Zeeman sublevels with angular frequency $\Omega=(\mu_B/h)B$, where $\mu_B$ is the Bohr magneton and h is Planck's constant. By turning off the pulse at a time when the atomic populations have an equal probability of being in the two states, $\Omega t=\pi/2$, a coherent superposition is induced between them. The coherence oscillates at the resonance frequency of the microwave radiation, modulating the atomic susceptibility and hence the refractive index of the medium near the resonance.

When probed by a weak beam, the oscillating refractive index generates sidebands in a process known as parametric frequency conversion. This process generates sidebands separated from the carrier by the frequency of the microwave magnetic coupling. In our illustrative embodiment, we use the $5s^2S_{1/2}$ ground state and F=|J+I|=1, 2 hyperfine ground state levels in a warm ensemble of $^{87}$Rb.

In example implementations of our techniques as discussed below, the sidebands used are sidebands of first order.

Figure 1:
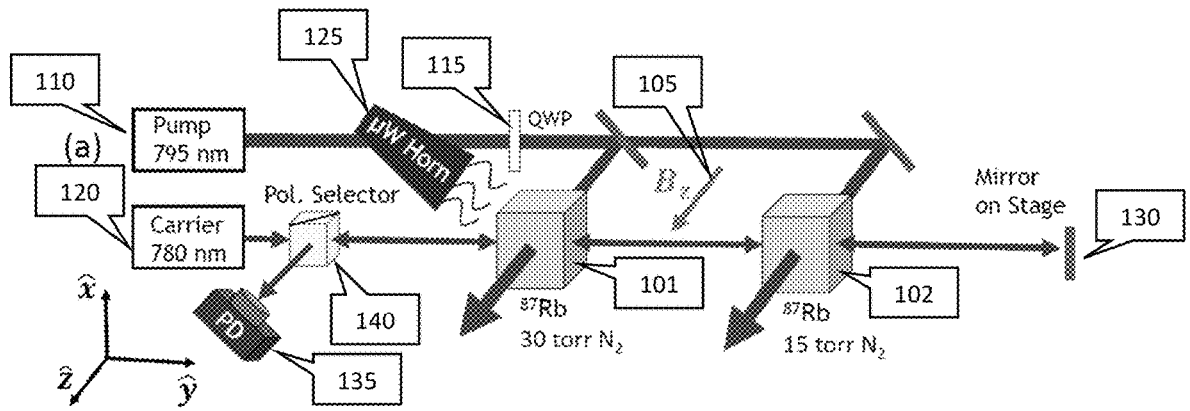
FIG. 1 is a simplified schematic diagram of a system for an atomic magnetic gradiometer of the kind described here. In the example shown in the figure, a pair of atomic vapor cells are shown as containing different pressures of buffer gas, in accordance with one of the new approaches described herein.

As shown in FIG. 1, we use two vapor cells 101, 102, each configured as a one-centimeter cube. The two cells are physically separated by the wavelength of the incoming microwave radiation, which in our example is 4.4 cm. We chose this separation so that both cells would experience the same microwave phase.

Both cells are filled, for example, with nitrogen ($N_2$) buffer gas. Possible alternative buffer gases include argon and neon, or even gas mixtures.

With the ambient field 105 along the direction of the pump, we set the quantization axis to be along the direction corresponding to the z axis in the figure.

The pump laser 110, tuned in our example to the D1 line at 795 nm, is circularly polarized by a quarter-wave plate (QWP) 115 before being directed through the vapor cells in the z direction, which is parallel to the quantization axis. The probe laser 120 is tuned in our example to the D2 line at a carrier wavelength of 780 nm. In the view of FIG. 1, the probe beam is transmitted sequentially through the vapor cells in they direction, which is orthogonal to the pump axis. The microwave $\pi/2$ pulse is applied from a suitable microwave emitter 125, which for illustrative purposes only is represented in the figure as a microwave horn. Alternatively, an antenna may be used, and may be preferable in order to make the assembly compact.

Optionally, a mirror 130 is used to reflect the once-modulated carrier back through the vapor cells to be subjected to modulation for a second time for signal enhancement before impingement on a photodetector 135 for readout of the beat note. Because the sidebands are polarized orthogonally to the unmodulated carrier, a polarization selector 140 can be used to filter the modulated carrier so that light that effectively contains only the sidebands will be impinged on the photodetector.

Alternatively to a polarization filter, or in addition thereto, a narrow-band frequency filter or an atomic filter cell can be used for optical filtration.

By measuring the frequency of the beat note signal using detection electronics, the value of the magnetic field gradient between the two sets of atoms can be obtained. Examples of detection electronics include, without limitation, a frequency counter and a data-acquisition system with a signal processor to compute frequency. To ease measurement of the frequency of the beat note signal, a bias magnetic field gradient can be added such that the frequency of the beat note is at an easily measurable value.

Figure 2:
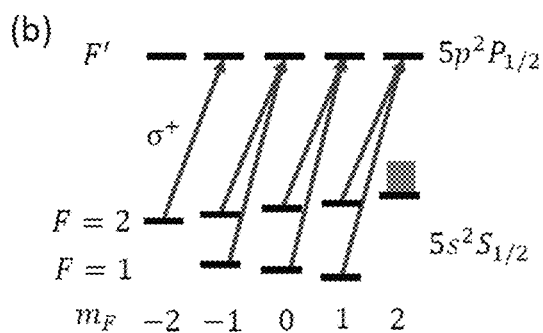
FIGS. 2 and 3 are partial transition diagrams for $^{87}$Rb illustrating state preparation (FIG. 2) and sideband-generation (FIG. 3) processes according to example embodiments.
Figure 3:
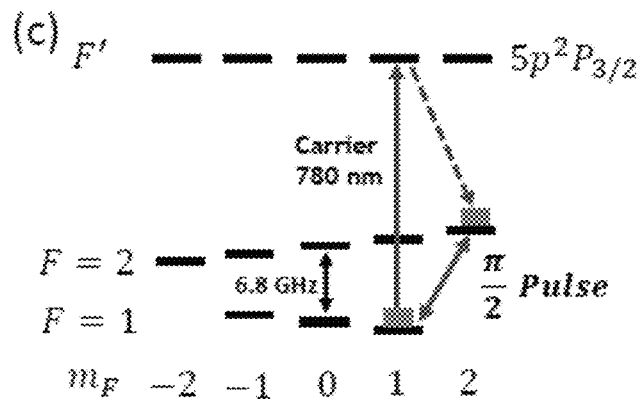

FIGS. 2 and 3 are partial transition diagrams for $^{87}$Rb illustrating the state preparation (FIG. 2) and sideband-generation (FIG. 3) processes. As seen in the diagram, the quantizing static magnetic field splits the $5s^2S_{1/2}$ level into a ground-state manifold of eight sublevels.

As indicated in FIG. 2, we apply a circularly polarized ($\sigma^+$) 795-nm pump laser on the $5s^2S_{1/2}\rightarrow 5p^2P_{1/2}$ D1 line. The atoms absorb angular momentum from the $\sigma^+$ light and make $\Delta m_F=+1$ transitions to the excited state, resulting in a net migration of atoms to the |F=2, $m_F$=2> end state. The |F=2, $m_F$=2> state is a dark state, that is, the atomic population is trapped and cannot be excited by the $\sigma^+$ pump light.

The pump is square-wave modulated at 200 kHz between the F=1 and F=2 ground states, clearing the atomic population that isn't in the dark end state. An acousto-optic modulator (AOM) is used as an optical switch for the pump beam.

With reference to FIG. 3, sideband generation is initiated by sending in a weak (12 µW) linearly polarized 780-nm carrier beam on the $5s^2S_{1/2}\rightarrow 5p^2P_{3/2}$ D2 line directionally orthogonal to the pump.

As shown in FIG. 3, the $\pi/2$ pulse of magnetic energy between the |F=1, $m_F$=1> and |F=2, $m_F$=2> sublevels brings the atoms into a coherent superposition.

The coherence of each atomic ensemble modulates the refractive index of the atoms at a modulation frequency. The modulation frequency is the sum of the hyperfine frequency of the clock transition, $v_{HF}$, plus the Zeeman splitting $vz=\gamma B$, where $\gamma$ is the gyromagnetic ratio. As noted above, the gyromagnetic ratio for $^{87}$Rb is 7 Hz/nT.

Since the coherence is established on the stretched states (i.e., the states of maximum $m_F$) of the F=1 and F=2 levels, the total Zeeman frequency shift is 3×7 Hz/nT for a total splitting of $v_{HF}$+21 Hz/nT×ΔB. This is the frequency offset of the sidebands from the carrier beam.

We perform this process in both vapor cells, thereby generating two sets of sidebands.

The sideband light exits the cells orthogonally polarized to the carrier. Accordingly, we use a polarizing beam splitter (PBS) to block the carrier light while allowing the sidebands to pass.

The sidebands are detected at the photodiode as a beat note. The frequency of the beat indicates the value of the magnetic gradient between the two atomic vapor cells.

In order to measure a beat frequency at zero field, we can use the fact that buffer gases, including nitrogen, shift the hyperfine frequency of atomic ensembles by an amount that depends on gas density, among other factors. Thus, for example, each cell can be filled with a different pressure of nitrogen buffer gas: E.g., 30 torr in the cell nearest the microwave radiation source and 15 torr in the other cell. This would offset the sidebands by 7 kHz at zero field. This approach is discussed in greater detail below.

Since the sidebands are generated from population in the end state of the manifold in each cell, the frequency offset of the sidebands due to the magnetic field is 21 Hz/nT×ΔB, hence the beat-note frequency in the present example, with offset, would be given by $f_b$=7 kHz+21 Hz/nT×ΔB.

Figure 4:
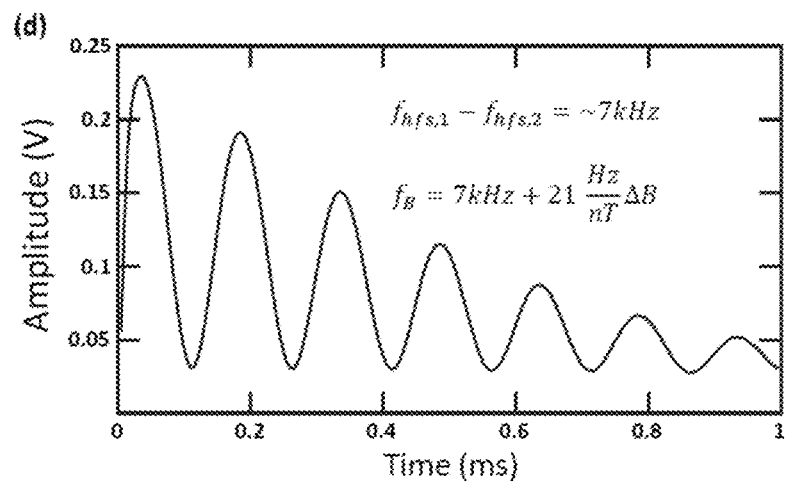
FIG. 4 shows an example of a beat note produced from a gradiometer of the kind described herein.

FIG. 4 shows an example of a beat note produced from the gradiometer. In order to measure its frequency, we fit it with a high-order polynomial and extract the frequency value.

It will be evident from FIG. 4 that the amplitude of the sidebands decays over time. That is because the optical sidebands are generated only for the duration of time when the atoms are in a coherent state. For $^{87}$Rb atoms confined in a 1-cm-cube vapor cell, this duration is typically on the order of 1 ms. Coherence is lost through various mechanisms including wall collisions, power broadening, and buffer-gas collisions. Because the generated beat-note signal also decays over time, the atoms must be periodically re-pumped to the coherent state.

An illustrative but non-limiting, repetition rate for a measurement is 500 Hz. At that rate, the pump may be turned on for, e.g., 1 ms in each repetition and then turned off, with the microwave π/2 pulse arriving a few microseconds later.

Figure 5:
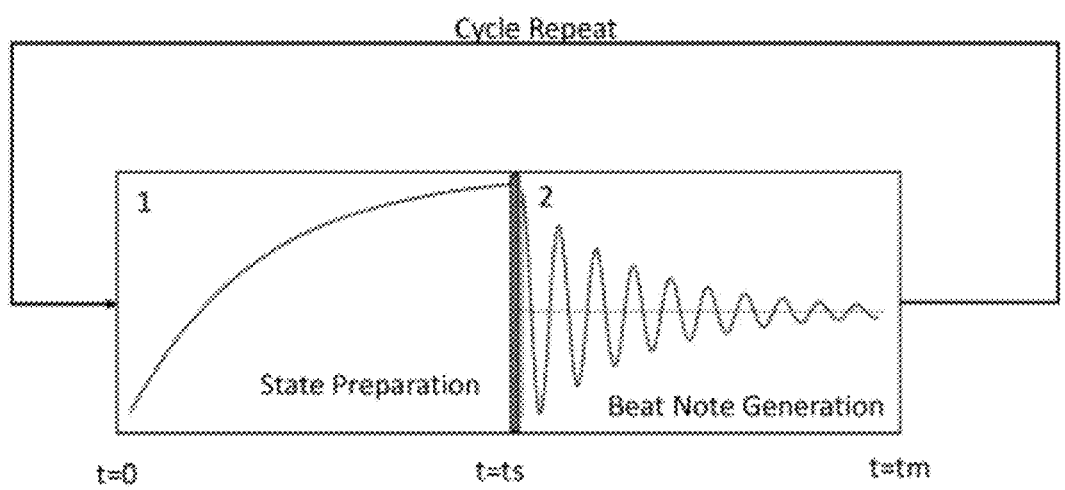
FIG. 5 is a timing diagram illustrating cyclic, two-state operation of an example gradiometer. In the figure, notional graphs of signal evolution illustrate a state-preparation stage followed by a beat-note stage in each cycle of operation.

Thus, as shown in FIG. 5, the gradiometer will generally be operated in two stages. The state-preparation stage 1 extends along the time axis from 0 to $t_s$, and the beat-note stage 2 extends from $t_s$ to $t_m$. After the beat-note signal has decayed substantially, the measurement process is restarted by preparing the atomic ensembles again in the coherent state at t=0.

A Method to Add a Frequency Offset Between the Respective Hyperfine Frequencies of the Two Vapor Cells.

If the beat frequency were allowed to go to zero in the absence of an ambient field, it would be difficult to confirm that the magnetometer was operating properly, and there would not be a signal for small changes in the gradient around a gradient of zero. It would also be difficult to observe effects due to the alignment of the magnetometer relative to the ambient field. Therefore, as briefly discussed above, it is desirable to provide an offset between the sidebands produced by the respective vapor cells that is independent of the ambient magnetic field.

Any of various values can be chosen for such an offset. By way of example, we have found a frequency offset of 7 kHz to be useful.

The buffer gas within the vapor cell produces a shift in the hyperfine frequency that is dependent on the buffer gas density, among other factors. In examples, the frequency offset is produced by filling the two cells with the same gas, but at different pressures.

Alternatively, or in addition, each cell may be filled with a different buffer gas or a different buffer gas mixture. Buffer gas mixtures, in particular, may be of interest for reducing temperature sensitivity or for giving the same optical linewidth while maintaining a frequency offset.

More specifically, the shift $\Delta v=(1/2\pi)\Delta\omega$ in the hyperfine frequency is approximated to second order in temperature by the expression $\Delta v=P_s(\beta_s+\delta_s\Delta T+\gamma_s\Delta T^2)$, where $P_s$ is the buffer-gas pressure, $\Delta T$ is the gas temperature in Celsius degrees, and $\beta_s$, $\delta_s$, and $\gamma_s$ are coefficients whose values for selected gases are listed in Table 1, which was taken from Vanier et al., J. Appl. Phys. Vol. 53, No. 8, August 1982, at page 5388.

|  | $\beta_s$ (Hz/torr) | $\delta_s$ (Hz/° C./torr) | $\gamma_s$ (Hz/° C.$^2$/torr) |
| --- | --- | --- | --- |
| Argon | −59.7 | −0.32 | −0.00035 |
| Krypton | −593.5 | −0.57 |  |
| Nitrogen | 547.9 | 0.52 | −0.0013 |

In experimental trials at an operating temperature of about 100° C. for the vapor cells, we produced a zero-field offset frequency of 7 kHz using nitrogen-filled cells at respective pressures of 15 torr and 30 torr.

More generally, a typical range of operating temperatures for the vapor cells is 80° C. to 120° C.

Figure 5A:
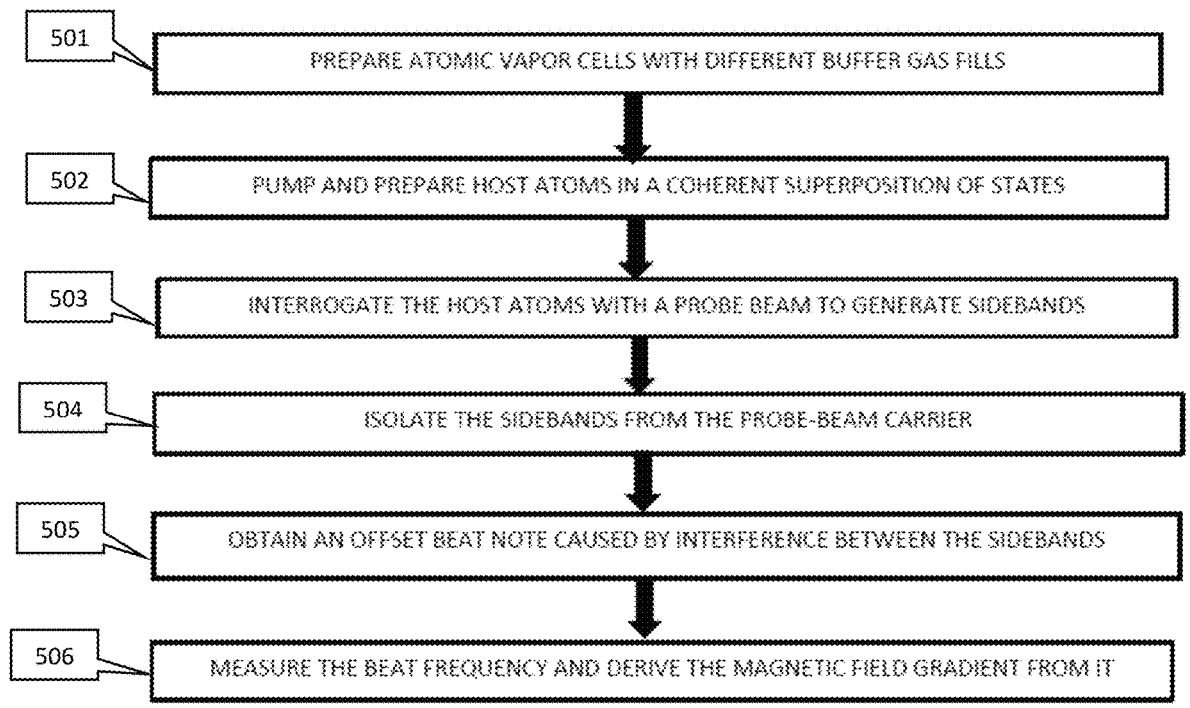
FIG. 5A is a flowchart illustrating a mode of operating a gradiometer with a frequency offset between the vapor cells.

FIG. 5A is a flowchart illustrating a mode of operating a gradiometer with a frequency offset between the vapor cells: At 501, the respective vapor cells are prepared with different fills of buffer gas. At 502, the host atoms are pumped and the coherent superposition of states is prepared. At 503, the probe interrogates the host atoms and the sidebands are generated. At 504, the sidebands are isolated from the carrier. At 505, the beat note between the sidebands is obtained, with an offset due to the different fills of buffer gas. At 506, the beat frequency is measured, and a measurement of the magnetic field gradient is obtained from the beat frequency.

A Method to Reduce the Temperature Sensitivity of the Hyperfine Frequency of the Vapor Cells.

In some implementations, the respective vapor cells can have different temperature coefficients (see Table 1). This difference can arise, for example, because the cells contain different buffer gases or different buffer-gas pressures. Unless compensated in some way, this is undesirable because it complicates the interpretation of the beat frequency.

We have found a way to compensate for this temperature dependence. One way to reduce the temperature dependence is to use a temperature insensitive buffer gas mixture as is often done in vapor cell atomic clocks. Our new approach relies on the fact that if a coherent superposition of states can be based on a $\Delta m_F$=1 transition, then, generally speaking, another coherent superposition can be based on a $\Delta m_F$=−1 transition.

Figure 6:
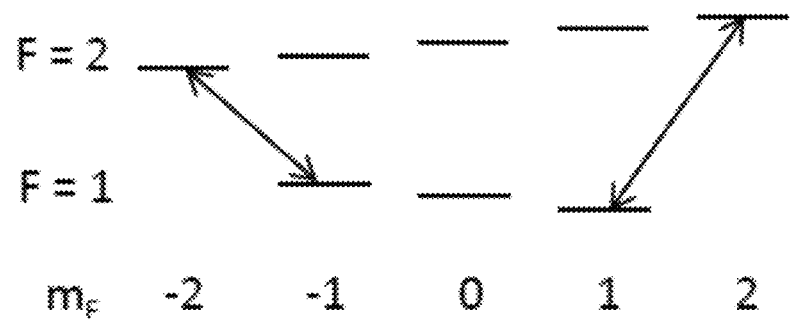
FIG. 6 is a partial transition diagram showing two transitions that can each give rise to a coherent superposition of states. The respective coherent superpositions that are shown have a substantially equal and opposite dependence on the magnetic field. For convenience, the corresponding transitions are referred to here as an "incremental" transition and as a "decremental" transition, respectively.

For example, FIG. 6 is a partial transition diagram showing two transitions that can each give rise to a coherent superposition of states with a substantially equal and opposite dependence on the magnetic field. The incremental transition is the |1,1>→|2, 2> transition discussed above. The decremental transition is the |1, −1>→|2, −2> transition.

Modulation by the incremental transition in the two vapor cells will produce a beat-note frequency equal to the relative temperature shift in the zero-field hyperfine frequency between the two cells, plus the quantity $3\gamma \times (B_1 - B_2)$, which we have discussed above.

Modulation by the decremental transition in the two vapor cells will produce a beat-note frequency equal to the same relative temperature shift in the zero-field hyperfine frequency between the two cells, minus the quantity $3\gamma \times (B_1 - B_2)$, which we have discussed above.

Hence, subtracting one beat frequency from the other produces the temperature-independent value, $\Delta\nu = 6\gamma \times (B_1 - B_2)$.

A more precise expression for $\Delta\nu$ can be obtained from the well-known Breit-Rabi formula for the energy of the hyperfine transition. Expanding the formula to third order in the ambient magnetic field, and subtracting the resulting frequencies for the respective beat notes yields the expression, $\Delta\nu = 6\gamma(B_1 - B_2) + (12\gamma^3/\nu(T)^2)(B_1^3 - B_2^3)$, where the temperature dependence is contained in the second term.

Figure 7:
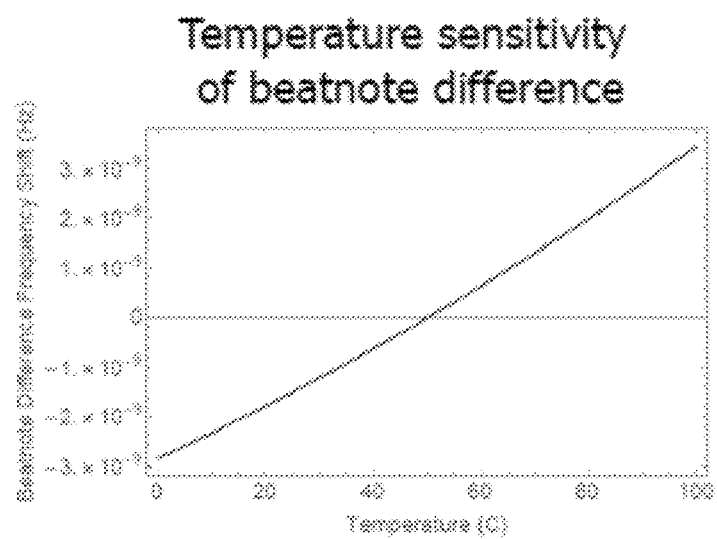
FIG. 7 is a theoretical graph illustrating the temperature dependence of a beat-note signal produced by a magnetic gradiometer of the kind described herein.

An example of the temperature shift in the beat-note difference $\Delta\nu$ is provided by FIG. 7, in which the theoretically calculated shift is plotted as a function of temperature. In the system modeled in FIG. 7, both cells are filled with nitrogen at a pressure of 30 torr. One cell is held at constant temperature, and the temperature of the other cell is varied. It will be evident that the shift depends only very weakly on temperature.

Each of the two beat frequencies can be measured by, for example, alternately interrogating first one of the two end states, and then the other. One way to do this is by switching the direction of the magnetic field that provides the quantization axis between interrogation cycles. Alternatively, the sense of the circular polarization of the pump beam could be switched between cycles.

In addition to cancelling temperature dependence, the method described here can also cancel small shifts in the energy splitting of the hyperfine states due to the light from the probe laser.

The method described does not require the respective cells to contain buffer gases at identical pressures or compositions.

Figure 7A:
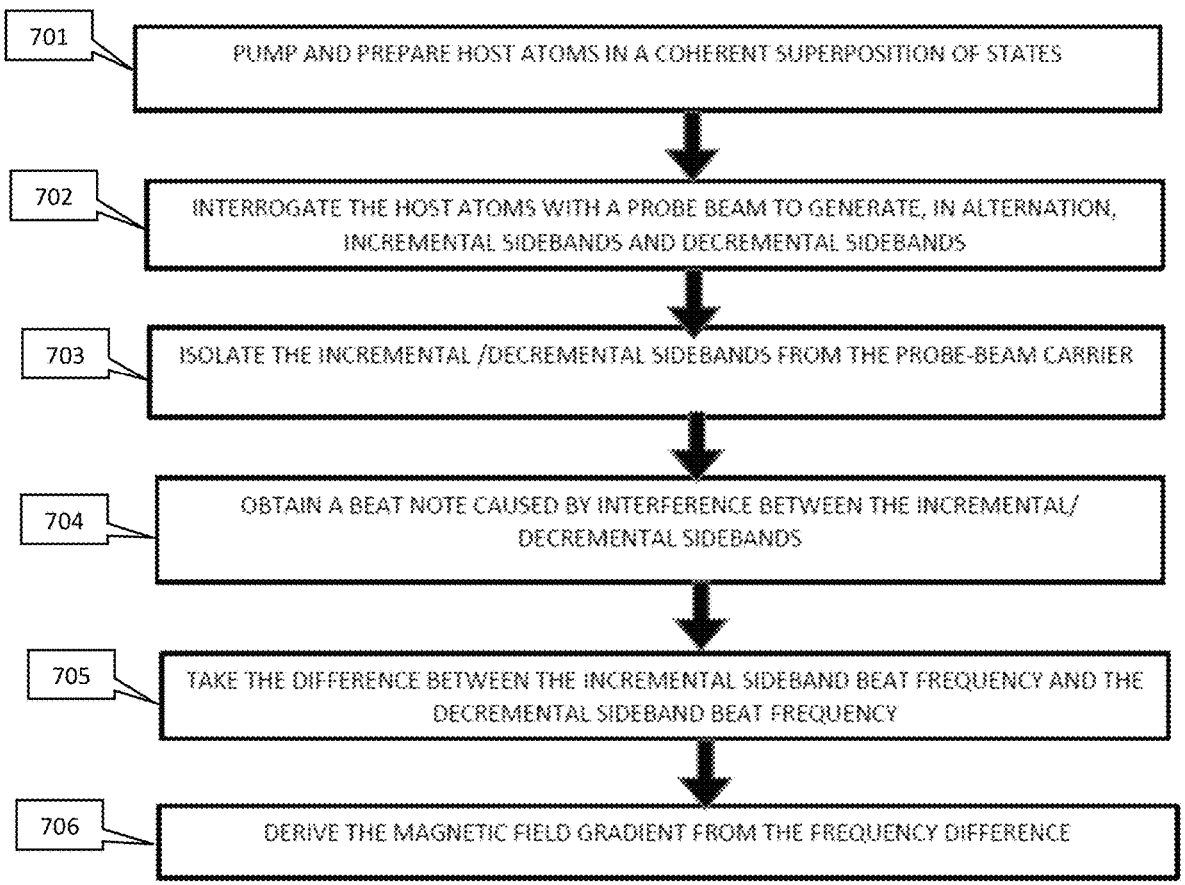
FIG. 7A is a flowchart illustrating a mode of operating a gradiometer with reduced sensitivity to temperature.

FIG. 7A is a flowchart illustrating a mode of operating a gradiometer with reduced sensitivity to temperature: At 701, the host atoms are pumped and the coherent superposition of states is prepared. At 702, the probe interrogates the host atoms and the sidebands are generated. As explained above, the process of state preparation can be varied so that one, and then the other, of the possible end states is interrogated. Accordingly, the incremental sidebands and the decremental sidebands can be produced in alternation.

At 703, the sidebands, which as noted alternated between incremental and decremental sidebands, are isolated from the carrier. At 704, the beat note between the (incremental or decremental) sidebands is obtained. At 705, the difference is taken between the beat frequency from the incremental sidebands and the beat frequency from the decremental sidebands. At 706, a measurement of the magnetic field gradient is obtained from the difference between the respective beat frequencies.

A Method to Allow Co-Propagation of the Pump and Probe Laser Beams, while Allowing the Measured Magnetic Field to have any Orientation Relative to the Laser Beams.

We found that by adding certain steps involving adiabatic transitions to the state preparation, it is possible to overcome the limitations that selection rules place on the pump and probe directions, relative to the ambient magnetic field that is to be measured. In addition, to enable a compact sensor, it is useful to have the pump and probe copropagating.

It is noteworthy in this regard that because of the selection rules, there will be a dead zone when the ambient magnetic field B is perpendicular to the pump, and there will be a dead zone when B is parallel to the probe.

In a system designed with the probe parallel to the pump, pointing the pump along B causes a dead zone because the probe is perforce also along B. Pointing the probe perpendicular to B causes a dead zone because the pump is also perforce perpendicular to B.

In a system designed with the probe perpendicular to the pump, pointing the probe along B causes the pump to point perpendicular to B, and both effects lead to a dead zone for that pointing direction.

The techniques described below are believed to be useful for mitigating the above problems.

Figure 8:
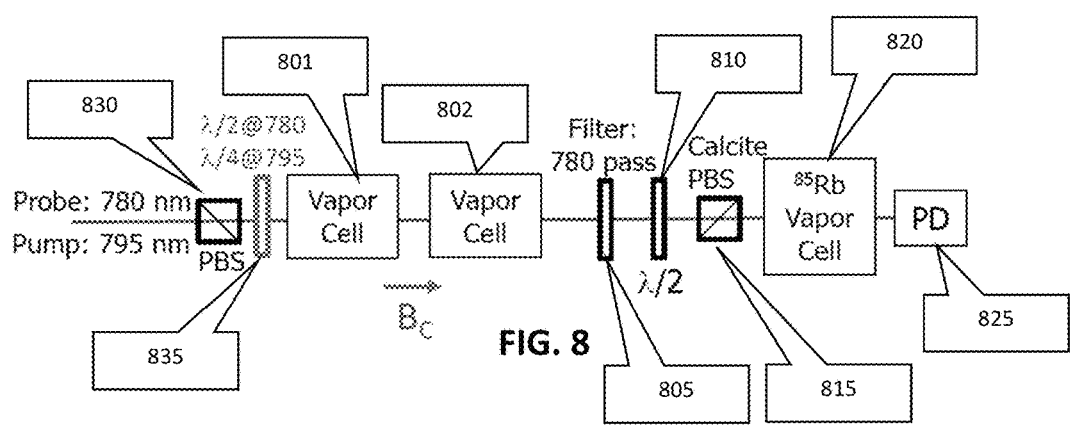
FIG. 8 is a schematic diagram of a magnetic gradiometer in a configuration adapted for coaxial propagation of the pump and probe beams.

FIG. 8 is a schematic diagram of the magnetic gradiometer, in a configuration adapted for coaxial propagation of the pump and probe beams.

A coil, not shown explicitly in the figure, generates a controllable applied magnetic field $B_C$ parallel to the laser axis, which is applied to the two vapor cells 801, 802. A series of additional optical elements represented in the figure as a 780-nm band-pass filter 805, a half-wave plate 810, a calcite polarization beam splitter 815, and a $^{85}$Rb vapor cell 820 are included to assure that carrier light will be excluded from impingement on the photodetector 825. The use of the $^{85}$Rb vapor cell is advantageous because, although the generated sidebands are orthogonally polarized to the carrier and can be separated from it on that basis, DC faraday rotation can still cause some of the carrier energy to reach the photodetectors. Polarization beam splitter 830 and wave plate 835, which is half-wave at the probe wavelength and quarter-wave at the pump wavelength, provide a linearly polarized probe beam and a circularly polarized pump beam.

The configuration of FIG. 8 has two modes of operation, one of which is designed to give a maximum signal in the "B-perpendicular" regime, and the other of which is designed to give a maximum signal in the "B-parallel" regime. In the "B-perpendicular" regime, the laser axis is perpendicular to the ambient field. In the "B-parallel" regime, the laser axis is parallel to the ambient field.

As explained above, state preparation is initiated by pumping the atomic ensembles. In some cases, it may be desirable to perform the pumping in the presence of an imposed, controllable magnetic field, whereas in some cases an imposed field may be unnecessary.

The atoms absorb angular momentum from circularly polarized pump light and undergo transitions to an end state with $\Delta m_F = +1$ or in some cases $\Delta m_F = -1$. The quantization necessary for this process is provided by the ambient magnetic field component parallel to the pump axis. As a consequence, state preparation is ineffective when the ambient field is perpendicular to the combined axes of the pump and probe lasers.

In the B-perpendicular mode of operation, we overcome this obstacle by using a coil to generate a magnetic field parallel to the laser axis. The field generated by the coil is used initially to provide the quantization axis. After the desired end state is reached, the coil is shut off along an adiabatic trajectory.

Figure 9:
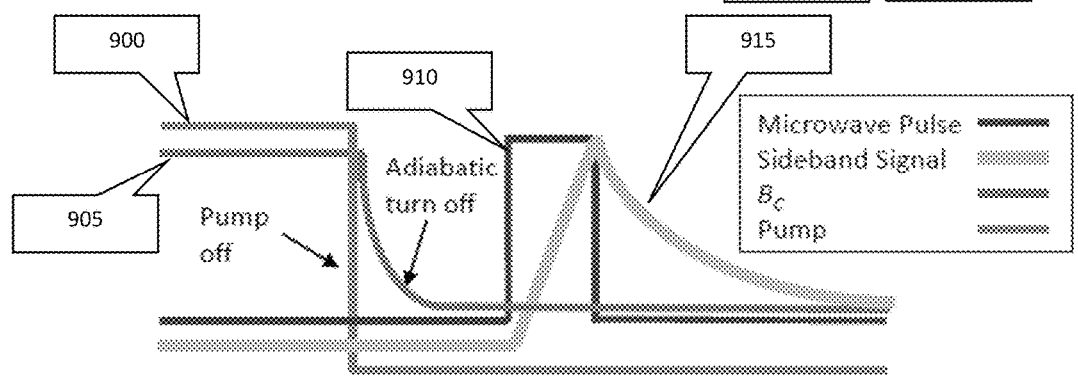
FIG. 9 is a timing diagram that provides an example of a sequence of optical and microwave pulses useful for state preparation in a mode of operation of a magnetic gradiometer in which the ambient magnetic field is perpendicular to the pump beam.

FIG. 9 is a timing diagram that provides an example of the sequence of the pulses used for state preparation in the B-perpendicular mode of operation. As shown, the pump 900 and the coil 905 are initially maintained concurrently in an on state. At the time that the pump is turned off, the current in the coil is gradually decreased so that the applied magnetic field decays along an adiabatic trajectory. This has the effect of adiabatically rotating the quantization field from the coil field $B_C$ to the ambient field that is to be measured. In order for the rotation to be adiabatic, the rotation rate of the field must be less than the Larmor precession frequency.

After the field has been fully rotated, the microwave π/2 pulse 910 is initiated and sidebands 915 in the probe beam are generated.

Figure 9A:
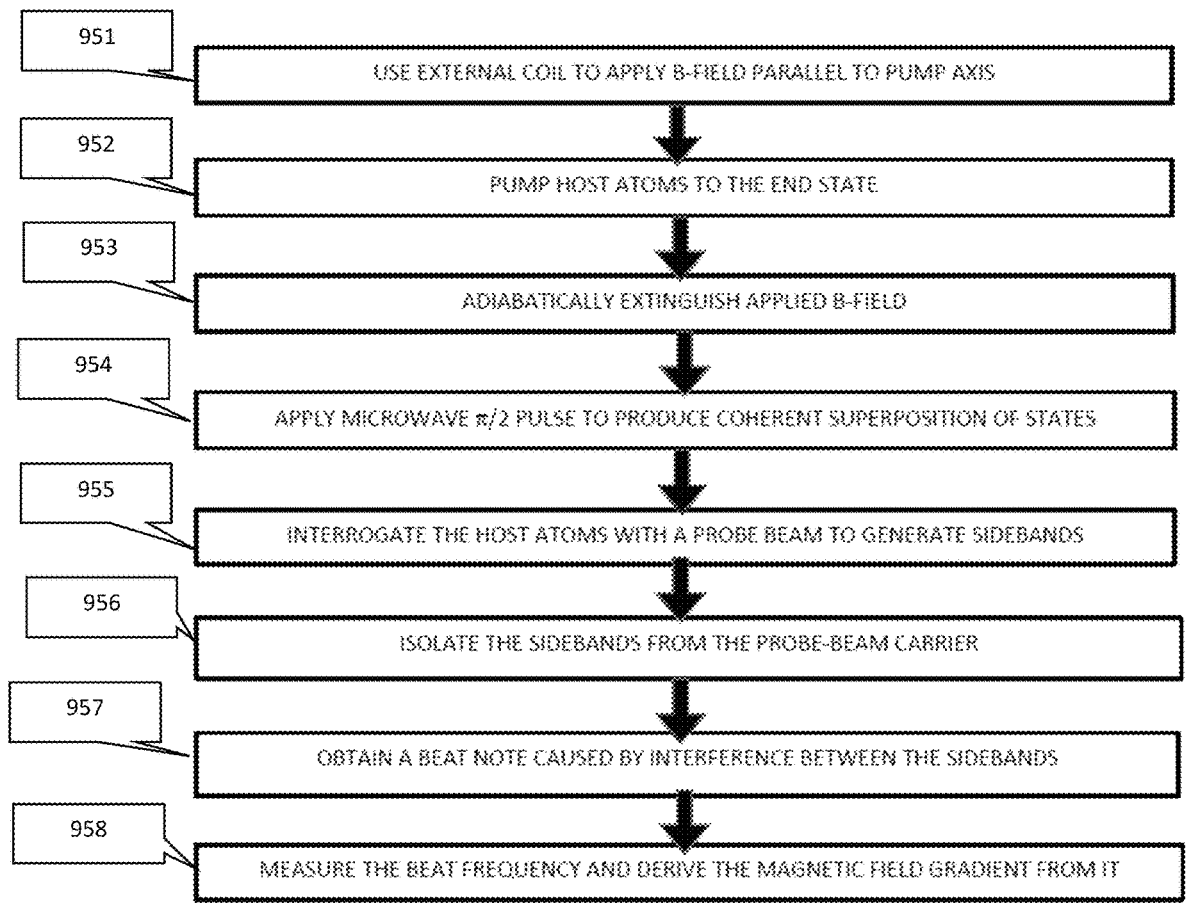
FIG. 9A is a flowchart illustrating a B-perpendicular mode of operating a gradiometer, which is advantageous when the ambient magnetic field is perpendicular to the pump axis.

FIG. 9A is a flowchart illustrating the B-perpendicular mode of operating a gradiometer. At 951, an external coil applies a magnetic field directed parallel to the axis of the pump beam. At 952, the host atoms are pumped to the end state. At 953, the external coil is slowly de-energized along a trajectory that adiabatically extinguishes the applied magnetic field. At 954, the microwave π/2 pulse is applied to produce the coherent superposition of states. At 955, the probe interrogates the host atoms and the sidebands are generated. At 956, the sidebands are isolated from the carrier. At 957, the beat note between the sidebands is obtained, and at 958 a measurement of the magnetic field gradient is obtained from the beat frequency.

When the ambient field is parallel to the axis of the probe beam, sidebands can be generated in the probe beam only by microwave transitions in which $\Delta m_F=0$. (More specifically, only $\sigma^+$ or $\sigma^-$ optical transitions can be excited by the probe when B is parallel to the probe beam. With a $\Delta m_F=1$ microwave excitation, a πoptical transition would be required, but that is forbidden by the selection rules.)

By direct optical pumping, we are only able to populate |2, 2> or |2, −2> state and then generate a pair of states that differ by a microwave $\sigma^+$ or $\sigma^-$ transition, i.e., a transition in which the magnetic quantum number $m_F$ changes by ±1.

Figure 10:
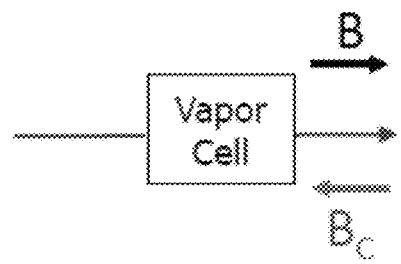
FIGS. 10-12 illustrate a mode of operation of a magnetic gradiometer, referred to here as the "B-parallel" mode, in which the ambient magnetic field is parallel to the pump beam.
Figure 11:
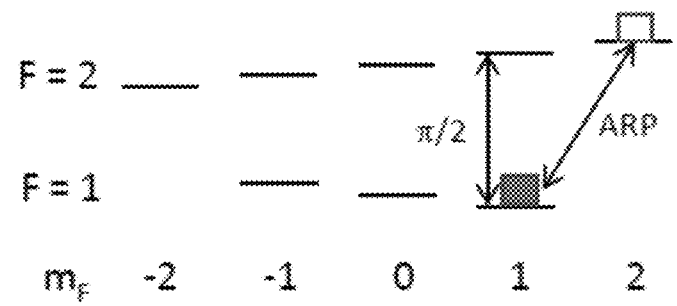
Figure 12:
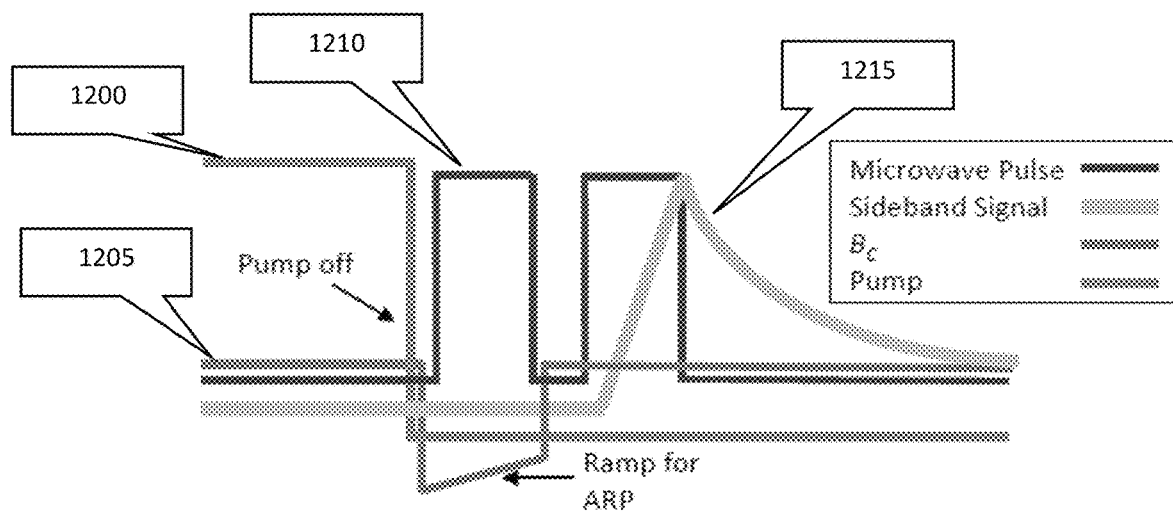

In the B-parallel mode of operation, we overcome this obstacle by adding an extra step to the process of state preparation. FIGS. 10-12 illustrate the modified process. FIG. 10 shows the orientations of the laser axis, the ambient field B, and the coil field $B_C$. FIG. 11 is a partial transition diagram showing the spin states that are involved in an example. FIG. 12 is a timing diagram that provides an example of the sequence of the pulses used for state preparation in the B-parallel mode of operation.

With joint reference to FIGS. 11 and 12, it will be seen that the pump laser 1200 is operated so as to populate, e.g., the |2, 2> state in the manner described previously. The pump is then turned off, and the magnetic coil 1205 is operated concurrently with the microwave source 1210 to induce adiabatic rapid passage (ARP) in the atomic ensembles. ARP transfers population from the |2, 2> state to the |1, 1> state. Note that this population transfer can be accomplished using a resonant microwave π-pulse.

ARP is performed by applying a square, first pulse of microwave energy, and during the microwave pulse, applying a magnetic field ramp from the magnetic coil to sweep the energy splitting of the states through resonance with the microwave radiation. After the first microwave pulse ends and the current in the coil is turned off, a second microwave pulse induces a coherent superposition between the |1, 1> and |2, 1> states. A sideband signal 1215 is generated by this coherent superposition.

Our two modes of operation can be used in alternation to determine which mode yields the strongest signal in any given situation.

Figure 12A:
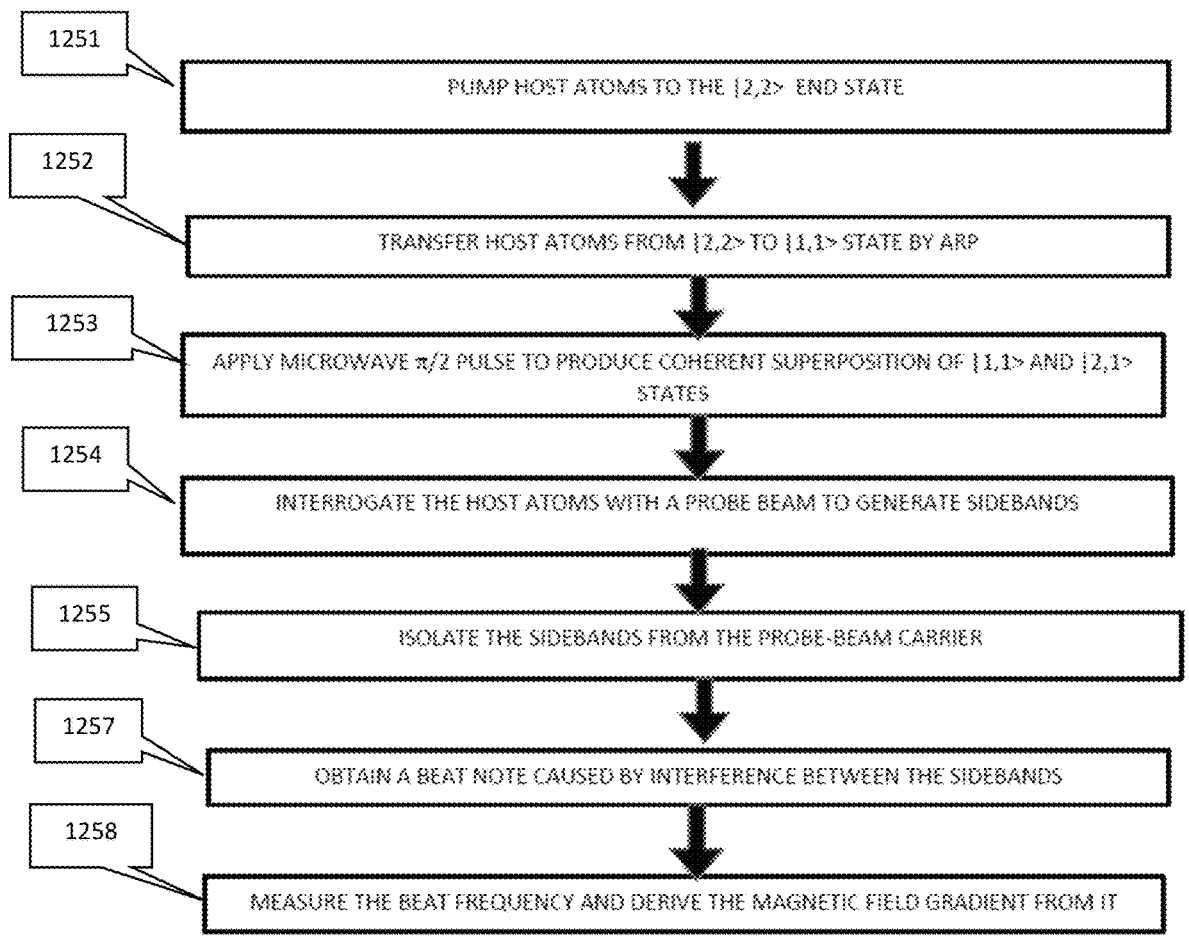
FIG. 12A is a flowchart illustrating, in an example, the B-parallel mode of operating a gradiometer.

FIG. 12A is a flowchart illustrating, in an example, the B-parallel mode of operating a gradiometer. At 1251, the host atoms are pumped to the initial end state |2,2>. At 1252, ARP is performed to transfer the host atoms to the state |1,1>. At 1253, the microwave π/2 pulse is applied to produce a coherent superposition of the |1,1> and |2,1> states. At 1254, the probe interrogates the host atoms and the sidebands are generated. At 1255, the sidebands are isolated from the carrier. At 1256, the beat note between the sidebands is obtained. At 1257, the beat frequency is obtained, and at 1258, a measurement of the magnetic field gradient is obtained from the beat frequency.

The example described above uses different light sources for the pump and the probe. However, it is also possible to use the same source laser to provide both the pump light and the probe light. The source laser provides circularly polarized light, which is also used as the "carrier" light for the probe. With a complex state-preparation scheme, it may be possible to achieve a coherent superposition of states that will generate sidebands of opposite circular polarization to the pump so that they can be isolated using a polarization-selective element. However, we expect that such an approach will be sensitive only to magnetic field components that lie along the direction of the source beam. Hence, a more generally applicable approach will isolate the sidebands from the carrier using a wavelength-selective optical element such as an etalon cavity. We believe, in this regard, that an etalon could be designed with a free spectral range that permits transmission of both the incremental and decremental sidebands, which would facilitate temperature-insensitive operation as discussed above.

In an example procedure using a single light source, a strong pumping pulse is produced first, for optical pumping of the atoms. After the pumping interval, the source light is attenuated, but maintained, for a second interval, which we refer to as the probing period. Depending on the experimental conditions, sidebands tend to be generated most efficiently when the probe is detuned from the pump frequency to suppress resonant absorption. Hence, the light source is preferably detuned during the probing period. In examples, detuning is effectuated by a voltage applied to the laser controller, according to known techniques, during the probe phase. The voltage is calibrated to shift the optical frequency by the desired amount of detuning.

Figure 13:
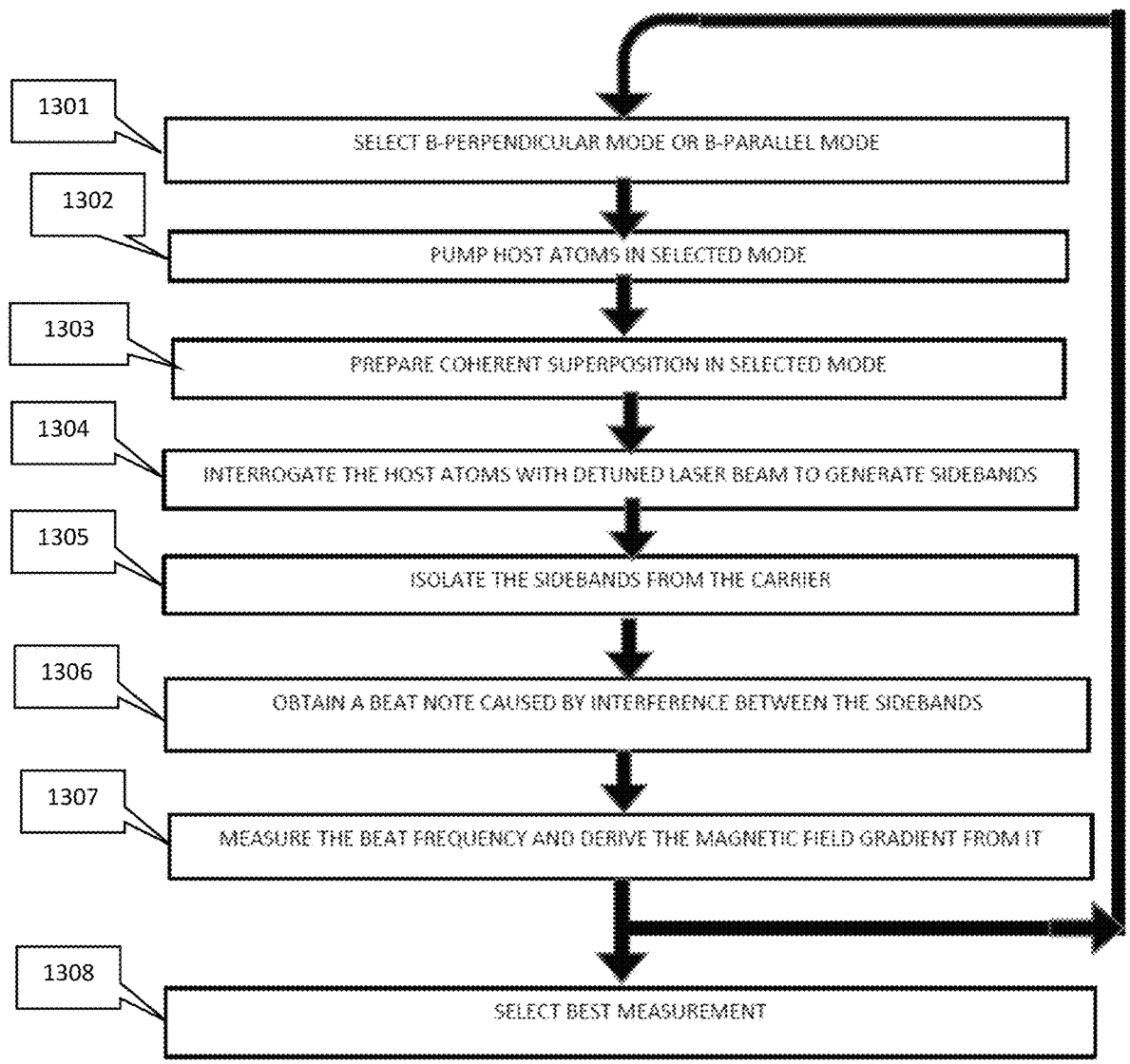
FIG. 13 is a flowchart illustrating a procedure for operating a magnetometer that uses a single source laser.

FIG. 13 is a flowchart illustrating a procedure for operating a magnetometer that uses a single source laser. At 1301, a selection is made between the B-perpendicular mode and the B-parallel mode. In examples, these two modes are selected in alternation as the procedure is iterated. At 1302, the host atoms are pumped to an end state in accordance with the selected mode. At 1303, the coherent superposition is prepared in accordance with the selected mode. At 1304, the detuned source laser interrogates the host atoms and the sidebands are generated. At 1305, the sidebands are isolated from the carrier. At 1306, the beat note between the sidebands is obtained, and at 1307, a measurement of the magnetic field gradient is obtained from the beat frequency. The procedure may then be iterated until a desired number of iterations has been reached. At 1308, after the last iteration, a best measurement of the magnetic field gradient may be selected.

We claim:
1. A method of sensing a magnetic field, comprising:
in a first atomic vapor cell and in a second atomic vapor cell situated at a distance from the first atomic vapor cell, preparing host atoms in a coherent superposition of two quantum states, the two quantum states differing in energy by an amount that depends upon a strength of an ambient magnetic field;
modulating an optical carrier in the first cell and in the second cell, thereby to impose on the carrier at least one first-order sideband from the first cell and at least one first-order sideband from the second cell, the sidebands from the respective cells having frequencies that depend on values of the ambient magnetic field at the respective cells where they arose;
impinging light comprising the sidebands onto a photodetector; and
measuring a beat frequency generated by interference between the sidebands from the respective cells, wherein:
the preparing of the host atoms is performed in one or more modes, wherein each mode comprises spin-polarizing host atoms and placing the spin-polarized host atoms in a coherent superposition of states; and
the preparing of the host atoms is performed at least in a mode here denominated the B-Perpendicular mode, which comprises:
spin-polarizing the host atoms with a pump beam of light while subjecting the host atoms to a controlled magnetic field directed parallel to the pump beam, and
then adiabatically extinguishing the controlled magnetic field,
whereby ambient magnetic field components perpendicular to the pump beam can be sensed.

2. The method of claim 1, wherein the first and second atomic vapor cells are both filled with nitrogen buffer gas.

3. The method of claim 1, further comprising filtering the modulated optical carrier with a polarization-selective element so that light that effectively contains only the sidebands is impinged on the photodetector.

4. The method of claim 1, further comprising filtering the modulated carrier with a narrow-band frequency filter or an atomic filter cell so that light that effectively contains only the sidebands is impinged on the photodetector.

5. The method of claim 1, wherein the host atoms are atoms of rubidium-87.

6. The method of claim 1, wherein the host atoms have a D1 atomic transition and a D2 atomic transition, the pump beam is tuned to one of the said transitions, and the probe carrier is tuned to the other of the said transitions.

7. The method of claim 1, wherein the atomic ensembles are prepared in a coherent superposition of $|F=2, m_F=2\rangle$ and $|F=1, m_F=1\rangle$ levels, wherein $F=2$ and $F=1$ represent different hyperfine ground states, and $m_F=2$ and $m_F=1$ are Zeeman sublevels of the hyperfine ground states.

8. The method of claim 1, wherein the coherent superposition is between Zeeman sublevels of two distinct hyperfine manifolds.

9. The method of claim 1, wherein the preparing the host atoms comprises, after spin-polarizing the host atoms, subjecting the spin-polarized host atoms to a microwave $\pi/2$ pulse having a frequency chosen to resonate with a pair of magnetically sensitive hyperfine energy levels.

10. The method of claim 1, wherein:
the atomic vapor cells are filled with respective fills of buffer gas that differ in pressure, in composition, or in both pressure and composition; and
the respective fills of buffer gas are selected such that absent an ambient magnetic field, the sidebands from the respective atomic vapor cells have different optical frequencies, whereby a non-zero beat frequency is generated both when an ambient magnetic field is present and when an ambient magnetic field is absent.

11. The method of claim 1, wherein:
the modulating of the optical carrier comprises, within each of the atomic vapor cells, using one of two atomic transitions to modulate the optical carrier and thereby produce a decremental sideband;
the modulating of the optical carrier further comprises, within each of the atomic vapor cells, using the other of the two atomic transitions to modulate the optical carrier and produce an incremental sideband;
the decremental and incremental sidebands have different sideband frequencies;
the measuring of the beat frequencies comprises measuring a decremental beat frequency generated by interference between the decremental sidebands generated within the first and second cells;
the measuring of the beat frequencies further comprises measuring an incremental beat frequency generated by interference between the incremental sidebands generated within the first and second cells; and
the method further comprises obtaining a subtractive difference between the decremental and incremental beat frequencies, thereby to obtain a magnetic field measurement with reduced temperature sensitivity.

12. A method of sensing a magnetic field, comprising:
in a first atomic vapor cell and in a second atomic vapor cell situated at a distance from the first atomic vapor cell, preparing host atoms in a coherent superposition of two quantum states, the two quantum states differing in energy by an amount that depends upon a strength of an ambient magnetic field;
modulating an optical carrier in the first cell and in the second cell, thereby to impose on the carrier at least one first-order sideband from the first cell and at least one first-order sideband from the second cell, the sidebands from the respective cells having frequencies that depend on values of the ambient magnetic field at the respective cells where they arose;
impinging light comprising the sidebands onto a photodetector; and
measuring a beat frequency generated by interference between the sidebands from the respective cells, wherein:
the preparing of the host atoms is performed in one or more modes, wherein each mode comprises spin-polarizing host atoms and placing the spin-polarized host atoms in a coherent superposition of states; and
the preparing of the host atoms is performed in at least one mode here denominated the B-Parallel mode, which comprises:
spin-polarizing the host atoms with a pump beam of light to place the host atoms in a first hyperfine state;
using an initial microwave pulse to transfer the host atoms to a second hyperfine state; and
xusing a subsequent microwave pulse, which is a $\pi/2$ pulse, to place the host atoms in a coherent superposition of the second hyperfine state with a third hyperfine state characterized in that the second and third hyperfine states have the same value of the hyperfine angular momentum quantum number $m_F$, whereby the modulating of the optical carrier is effective at least when the optical carrier is propagating in a direction parallel to the ambient magnetic field.

13. The method of claim 12, wherein the host atoms are transferred from the first hyperfine state to the second hyperfine state by a process of adiabatic rapid passage (ARP).

14. The method of claim 13, wherein the pump beam and the optical carrier traverse parallel paths through the atomic vapor cells.

15. The method of claim 14, wherein the B-parallel mode and the B-perpendicular mode are performed in alternation.

16. The method of claim 1, wherein source light from a single light source provides, sequentially, both the pump beam and the optical carrier.

17. The method of claim 16, wherein, in a sequence, the pump light is provided initially as a strong pulse for optical pumping, and is then attenuated and detuned to provide the optical carrier.

18. The method of claim 12, wherein:
the atomic vapor cells are filled with respective fills of buffer gas that differ in pressure, in composition, or in both pressure and composition; and
the respective fills of buffer gas are selected such that absent an ambient magnetic field, the sidebands from the respective atomic vapor cells have different optical frequencies, whereby a non-zero beat frequency is generated both when an ambient magnetic field is present and when an ambient magnetic field is absent.

19. The method of claim 12, wherein:
the modulating of the optical carrier comprises, within each of the atomic vapor cells, using one of two atomic transitions to modulate the optical carrier and thereby produce a decremental sideband;
the modulating of the optical carrier further comprises, within each of the atomic vapor cells, using the other of the two atomic transitions to modulate the optical carrier and produce an incremental sideband;
the decremental and incremental sidebands have different sideband frequencies;
the measuring of the beat frequencies comprises measuring a decremental beat frequency generated by interference between the decremental sidebands generated within the first and second cells;
the measuring of the beat frequencies further comprises measuring an incremental beat frequency generated by interference between the incremental sidebands generated within the first and second cells; and
the method further comprises obtaining a subtractive difference between the decremental and incremental beat frequencies, thereby to obtain a magnetic field measurement with reduced temperature sensitivity.

* * * * *